United States Patent
Jacob et al.

(10) Patent No.: US 9,240,342 B2
(45) Date of Patent: Jan. 19, 2016

(54) METHODS OF FORMING REPLACEMENT FINS FOR A FINFET SEMICONDUCTOR DEVICE BY PERFORMING A REPLACEMENT GROWTH PROCESS

(71) Applicant: GLOBALFOUNDRIES Inc., Grand Cayman (KY)

(72) Inventors: Ajey P. Jacob, Albany, NY (US); Murat K. Akarvardar, Saratoga Springs, NY (US); Jody Fronheiser, Delmar, NY (US); Witold P. Maszara, Morgan Hill, CA (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 9 days.

(21) Appl. No.: 13/944,200

(22) Filed: Jul. 17, 2013

(65) Prior Publication Data

US 2015/0024573 A1   Jan. 22, 2015

(51) Int. Cl.
| | | |
|---|---|---|
| *H01L 21/762* | (2006.01) | |
| *H01L 29/66* | (2006.01) | |
| *H01L 29/78* | (2006.01) | |
| *H01L 27/12* | (2006.01) | |

(52) U.S. Cl.
CPC .... *H01L 21/76224* (2013.01); *H01L 29/66628* (2013.01); *H01L 27/1203* (2013.01); *H01L 29/66765* (2013.01); *H01L 29/785* (2013.01); *H01L 29/7848* (2013.01); *H01L 29/7851* (2013.01)

(58) Field of Classification Search
CPC .......... H01L 21/76224; H01L 29/66628; H01L 29/66765; H01L 29/785; H01L 29/7848; H01L 29/7851; H01L 21/336
USPC .......... 438/424, 270, 150, 156; 257/301, 328, 257/E21.384, E29.321
See application file for complete search history.

(56) References Cited

U.S. PATENT DOCUMENTS

| | | | | |
|---|---|---|---|---|
| 2009/0321836 A1* | 12/2009 | Wei et al. | | 257/365 |
| 2010/0072515 A1* | 3/2010 | Park et al. | | 257/190 |
| 2011/0097881 A1* | 4/2011 | Vandervorst et al. | | 438/486 |
| 2011/0183508 A1* | 7/2011 | Chan et al. | | 438/591 |
| 2013/0270628 A1* | 10/2013 | Huang et al. | | 257/329 |

OTHER PUBLICATIONS

Cheng et al., "Aspect Ratio Trapping Heteroepitaxy for Integration of Germanium and Compound Semiconductors on Silicon," IEEE 2008.

Houghton et al., "Equilibrium critical thickness for Si1-xGex strained layers on (100) Si," Appl. Phys. Lett., 56:460-62, Jan. 1990.

(Continued)

*Primary Examiner* — Thinh T Nguyen
(74) *Attorney, Agent, or Firm* — Amerson Law Firm, PLLC

(57) ABSTRACT

Various methods are disclosed herein for forming alternative fin materials that are in a stable or metastable condition. In one case, a stable replacement fin is grown to a height that is greater than an unconfined stable critical thickness of the replacement fin material and it has a defect density of $10^4$ defects/cm$^2$ or less throughout its entire height. In another case, a metastable replacement fin is grown to a height that is greater than an unconfined metastable critical thickness of the replacement fin material and it has a defect density of $10^5$ defects/cm$^2$ or less throughout at least 90% of its entire height.

12 Claims, 10 Drawing Sheets

(56) References Cited

OTHER PUBLICATIONS

Jain et al., "A new study of critical layer thickness, stability and strain relaxation in pseudomorphic GexSi1-x strained epilayers," Philosophical Magazine A, 65:1151-67, 1992.

Kasper et al., "Strain relaxation of metastable SiGe/Si: Investigation with two complementary X-ray techniques," Journal of Applied Physics, 111:063507, 2012.

Kim et al., "Increased critical thickness for high Ge-content strained SiGe-on-Si using selective epitaxial growth," Applied Physics Letters, 97:262106, 2012.

Paul, "Silicon-Germanium Strained Layer Materials in Microelectronics," Advanced Materials, 11:191-204, 1999.

Paul, "Si/SiGe heterostructures: From material and physics to devices and circuits," Review Article submitted to Semicond. Sci. Technol.

* cited by examiner

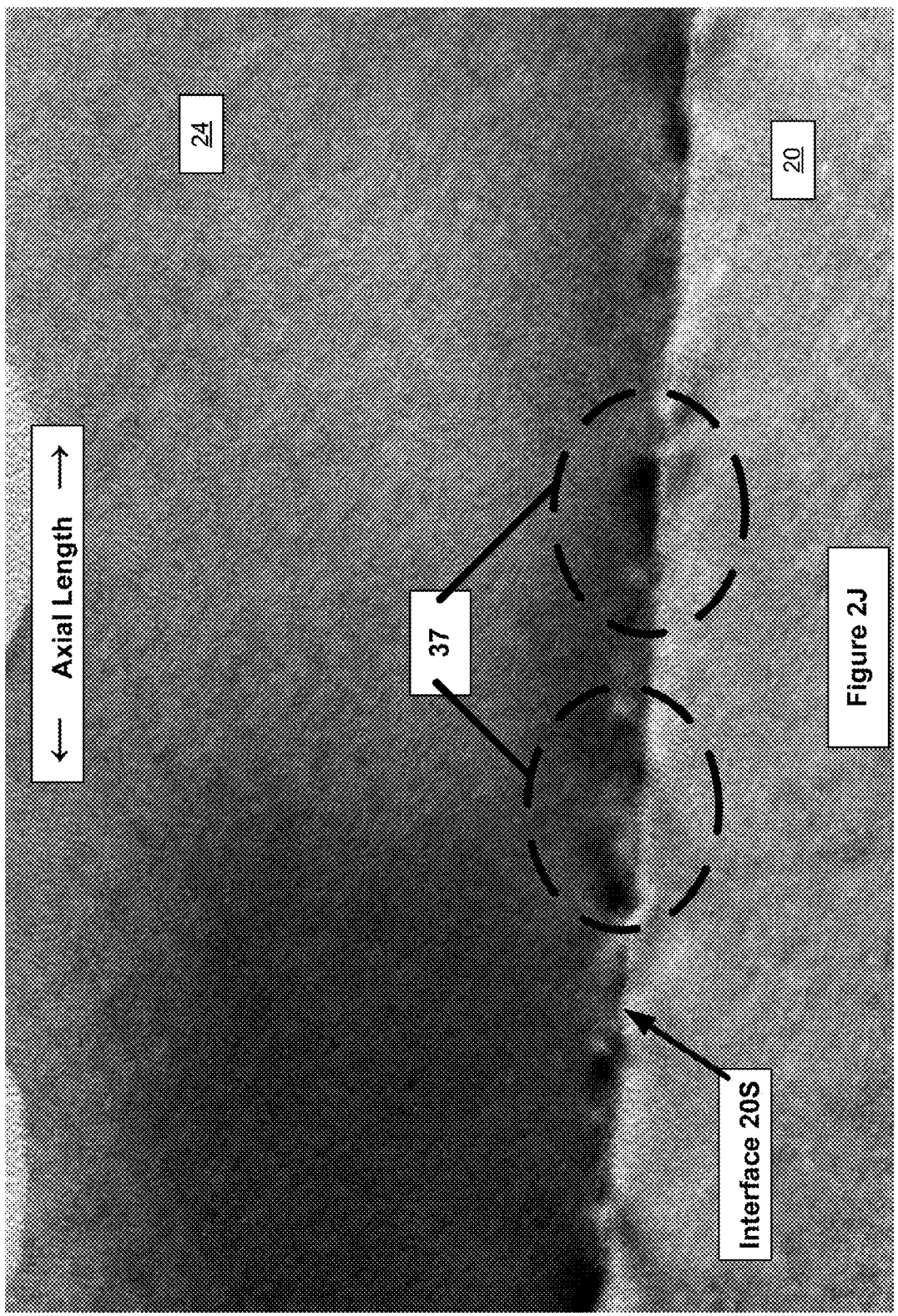

US 9,240,342 B2

METHODS OF FORMING REPLACEMENT FINS FOR A FINFET SEMICONDUCTOR DEVICE BY PERFORMING A REPLACEMENT GROWTH PROCESS

BACKGROUND OF THE INVENTION

1. Field of the Invention

Generally, the present disclosure relates to the manufacture of FET semiconductor devices, and, more specifically, to various replacement growth methods for forming substantially defect-free replacement fins for a FinFET semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device A that is formed above a semiconductor substrate B. The device A includes three illustrative fins C, a gate structure D, sidewall spacers E and a gate cap layer F. The gate structure D is typically comprised of a layer of insulating material (not shown), e.g., a layer of high-k insulating material, and one or more conductive material layers that serve as the gate electrode for the device A. In this example, the fins C are comprised of a substrate fin portion C1 and an alternative fin material portion C2. The substrate fin portion C1 may be made of silicon, i.e., the same material as the substrate, and the alternative fin material portion C2 may be made of a material other than the substrate material, for example, silicon germanium. The fins C have a three dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source drain regions.

In the FinFET device A, the gate structure D encloses both sides and the upper surface of all or a portion of the fins C to form a tri-gate structure so as to use a channel having a three-dimensional structure instead of a planar structure. In some cases, an insulating cap layer, e.g., silicon nitride, is positioned at the top of the fin C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called III-V materials, to manufacture FinFET devices which are intended to enhance the performance capabilities of such devices, e.g., to enable low-voltage operation.

However, the integration of such alternative materials on silicon substrates (the dominant substrates used in the industry) is a non-trivial matter due to, among other issues, the large difference in lattice constants between such alternative materials and silicon. That is, with reference to FIG. 1A, the lattice constant of the alternative fin material portion C2 of the fin C may be greater than the lattice constant of the substrate fin portion C1 of the fin C. As a result of this mismatch in lattice constants, an unacceptable number of defects may be formed or created in the alternative fin material portion C2. As used herein and in the claims attached hereto, a "defect" is a misfit dislocation in the crystalline structure of the alternative fin material portion C2 of the fin C.

With respect to forming such lattice-constant-mismatched materials on one another, there is a concept that is generally referred to as the "critical thickness" of a material. The term "critical thickness" generally refers to materials that are in one of three conditions, i.e., so-called "stable," "metastable" or "relaxed-with-defects" conditions. These three conditions also generally reflect the state of the strain on the material. That is, a stable material is in a fully-strained condition that is 100% strained in at least one crystalline plane of the material, a relaxed-with-defects material is a material that has zero strain in all crystalline planes, and a metastable material is strained to a level that is above zero strain but less than 100% strained in at least one crystalline plane of the metastable material. In general, a fully-strained (stable) material or a partially-strained (metastable) material will have fewer defects than a fully relaxed, unstrained material.

FIG. 1B is a graph taken from an article entitled "Silicon-Germanium Strained Layer Materials in Microelectronics" by Douglas J. Paul that was published in *Advanced Materials* magazine (11(3), 101-204 (1999)). FIG. 1B graphically depicts these three conditions for silicon germanium materials ($Si_{1-x}Ge_x$; x=0-1). The vertical axis is the critical thickness in nanometers. The horizontal axis is the concentration of germanium in the silicon germanium material. At the leftmost point on the horizontal axis is pure silicon (Ge concentration equals 0.0). At the rightmost point on the horizontal axis is pure germanium (Ge concentration equals 1.0). The two curves R and S define the stable, metastable and relaxed-with-defects regions for silicon germanium materials having differing germanium concentration levels. Above and to the right of curve R are materials that are in the relaxed-with-defects condition. Below and to the left of the curve S are materials that are in the stable condition. The region between the two curves R and S defines the region where materials are in the metastable condition.

To add more precision to the terminology regarding critical thickness, the term "stable critical thickness" will be used herein and in the attached claims to refer to a maximum thickness of a material at which it may be formed in a substantially defect-free and "fully-strained" condition above a substrate material, i.e., in an unconfined growth environment. Additionally, as used herein and in the attached claims, the term "metastable critical thickness" will be used to refer to a maximum thickness of a material at which it may be formed in a metastable condition above a substrate material, i.e., in an unconfined growth environment. As noted above, a material that is in the metastable condition is a material that has experienced some degree of strain-relaxation, but still remains strained to some degree (i.e., 1-99% strained but not 100% strained) in one crystalline plane of the metastable material such that defects are not typically formed in the metastable material itself. However, a metastable material may or may not have some amount of defects at the interface between the alternative material and a silicon substrate depending upon the amount of strain relaxation that has happened to the material.

With reference to FIG. 1B, a layer of pure germanium (Ge concentration equal to 1.0) may be in the stable condition at a thickness up to about 1-2 nm (point CT1) and it may be in a metastable condition for thicknesses between about 2-4 nm (point CT2). Above a thickness of about 4 nm, a layer of pure germanium will be in the relaxed-with-defects condition. In contrast, a layer of silicon germanium with a 50% concentration of germanium may be in the stable condition at thicknesses up to about 4 nm (point CT3) and it may be in a metastable condition for thicknesses between about 4-30 nm (point CT4). Above a thickness of about 30 nm, a layer of silicon germanium with a 50% concentration of germanium will be in the relaxed-with-defects condition.

A material that is in the relaxed-with-defects condition is a material that contains visible defects that are indicative that the material has relaxed to the point where defects have been formed in the material. For example, FIG. 1C is a TEM photograph of a crosssectioned fin of a FinFET device (taken along the axial length "L" of the fin) wherein the substrate fin C1 is comprised of silicon and the alternative fin material portion C2 of the fin is comprised of silicon germanium with a 50% concentration of germanium ($SiGe_{0.5}$). The axial length direction "L" and height direction "H" of the fin are indicated in FIG. 1C. In this example, the thickness or height "H" of the alternative fin material C2 was about 30 nm, a thickness greater than the metastable critical thickness for this material (which is about 30 nm according to FIG. 1B). Accordingly, the alternative fin material C2 is in the relaxed-with-defects condition and defects are visible throughout the alternative fin material C2 and at the interface between the materials C1/C2. Thus, in the example, the alternative fin material C2 shown in FIG. 1C is fully relaxed in all three directions—axial length L, height H and width W, i.e., it is in the relaxed-with-defects condition.

As another example, a substantially pure layer of germanium (Ge concentration equal to 1.0) may have a maximum stable critical thickness of about 1-2 nm when formed on a silicon substrate, i.e., in an unconfined growth environment. A substantially pure layer of germanium formed to a thickness of 1-2 nm or less would be considered to be a stable, fully-strained layer of germanium. In contrast, a layer of silicon germanium with a concentration of germanium of about fifty percent ($SiGe_{0.5}$) may have a maximum stable critical thickness of about 4 nm and still be substantially free of defects, i.e., in a stable condition. However, such a layer of germanium or silicon germanium would no longer be considered to be a stable material if grown beyond their respective maximum stable critical thickness values. When such a layer of material is grown to a thickness that is greater than its maximum stable critical thickness but less than its maximum metastable thickness, it is considered to be a metastable material that would start experiencing some degree of relaxation, i.e., there will be some degree of strain relaxation along one or more of the crystalline planes of the material and there may or may not be some defects present at or near the interface between the alternative fin material and the substrate fin. Thus, in general, the formation of stable, fully-strained, substantially defect-free alternative materials on silicon is limited to very thin layers of the alternative materials.

The presence of defects in an alternative-material fin structure would be detrimental to device operations. One process that has been investigated for use in forming such alternative fin materials is known as aspect-ratio-trapping (ART). In general, the ART process involves forming a masking layer, such as silicon dioxide, above a semiconductor substrate, such as silicon, patterning the masking layer to define a trench that exposes the underlying substrate, and performing an epitaxial growth process to form an alternative fin material, e.g., silicon germanium, on the exposed substrate, wherein the growth is confined within the trench. That is, the ART process involves epitaxially growing fully relaxed, unstrained material hetero-structures in a high aspect-ratio silicon dioxide trench having an aspect ratio of 5 or greater in an effort to decrease defects. In some applications, the ART process may involve the formation of trenches that have a very high aspect ratio, e.g., about 25-30. Importantly, in the ART process, the trench is made deep enough such that defects generated in the alternative fin material will be trapped at or near the bottom of the original trench and in the sidewalls of the trench positioned slightly above the interface between the substrate material and the alternative fin material. The amount of defects generated and the propagation of such defects will depend upon the crystal orientation of the substrate. The intent of the ART process is that, while the defect-containing fin material is present at or near the bottom of the trench, the upper-most portions of the epitaxially grown alternative fin material will be substantially defect-free material but, importantly, it is an un-strained material. That is, the alternative fin material is fully relaxed in all crystalline planes, e.g., in the crystalline planes that correspond to the axial length direction, height direction and width direction of the fin. This occurs due to the "trapping" of the defects at or near the bottom of the trench, with the result being the formation of substantially defect-free alternative fin material above the defective-containing portions of the alternative fin material in the lower portion of the trench. The ART process reduces the thickness of the material requirement for non-defective growth in comparison to the blanket growth of a similar structure. However, in the ART growth process, there are intentionally-formed defects present in the bottom portion of the alternative fin material as well as defects at the interface of the hetero-structure, and the grown material is typically relatively thick, e.g., about 200-300 nm, which corresponds to the fin height direction. The defects are generated along the 111 crystallographic direction of the alternative fin material and they are captured or stopped by the sidewalls of the trench.

The present disclosure is directed to various methods of forming replacement fins for a FinFET semiconductor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various replacement growth methods for forming replacement fins for a FinFET semiconductor device. One illustrative method disclosed herein includes forming a trench in a layer of insulating material that is positioned above a substrate comprised of a first semiconductor material, wherein the trench has a bottom width that is less than or equal to 20 nm and a depth that is 60 nm or less, and performing an epitaxial deposition process to form a stable replacement fin material above the substrate, wherein the replacement fin has a height that is 60 nm or less and it is fully-strained along a crystalline plane that corresponds to an axial length direction of the replacement fin and wherein the replacement fin is comprised of a second semiconductor material that is different than the first semiconductor material.

Another illustrative method disclosed herein includes forming a trench in a layer of insulating material that is positioned above a substrate comprised of a first semiconductor material, wherein the trench has a bottom width that is less than or equal to 20 nm and a depth that is 60 nm or less, and performing an epitaxial deposition process to form a stable replacement fin material above the substrate, wherein the replacement fin is comprised of a second semiconductor material that is different than the first semiconductor material, has a height that is greater than an unconfined stable critical thickness of the second semiconductor material and has a defect density of $10^4$ defects/cm$^2$ or less throughout its entire height.

Yet another illustrative method disclosed herein includes forming a trench in a layer of insulating material that is positioned above a substrate comprised of a first semiconductor material, wherein the trench has a bottom width that is less than or equal to 20 nm and a depth that is 60 nm or less, and performing an epitaxial deposition process to form a metastable replacement fin material above the substrate, wherein the replacement fin has a height that is 60 nm or less and it is partially-strained along a crystalline plane that corresponds to an axial length direction of the replacement fin and wherein the replacement fin is comprised of a second semiconductor material that is different than the first semiconductor material.

A further method disclosed herein includes forming a trench in a layer of insulating material that is positioned above a substrate comprised of a first semiconductor material, wherein the trench has a bottom width that is less than or equal to 20 nm and a depth that is 60 nm or less, and performing an epitaxial deposition process to form a metastable replacement fin material above the substrate, wherein the replacement fin is comprised of a second semiconductor material that is different than the first semiconductor material, has a height that is greater than an unconfined metastable critical thickness of the second semiconductor material and has a defect density of $10^5$ defects/cm$^2$ or less throughout at least 90% of its entire height.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L depict various illustrative novel replacement growth methods disclosed herein for forming replacement fins for a FinFET semiconductor device.

Figure 1A:
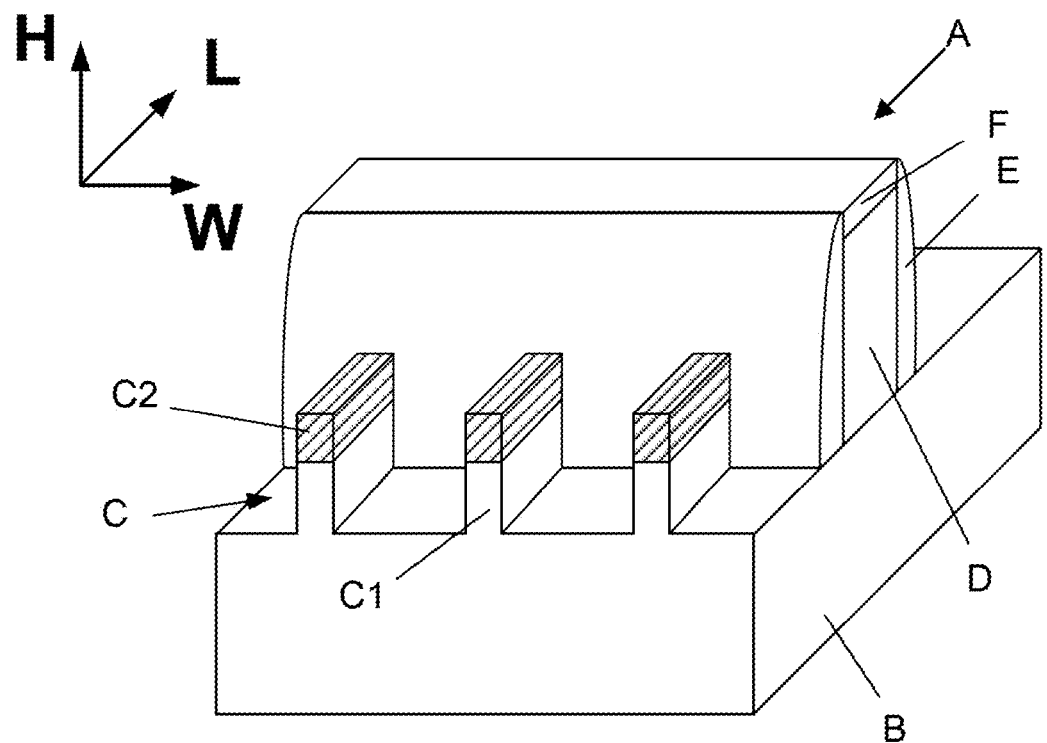
FIGS. 1A-1C depict examples of prior art FinFET devices wherein the fins for the device are comprised of an alternative fin material formed above a substrate fin.
Figure 1B:
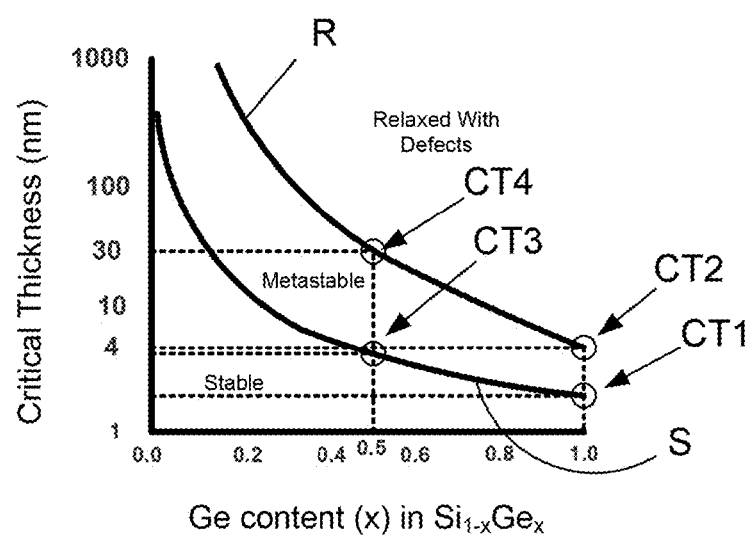

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various replacement growth methods for forming replacement fins for a FinFET semiconductor device. The methods disclosed herein may be employed in manufacturing either an N-type device or a P-type device, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

The replacement fins disclosed herein may be formed using a variety of techniques. FIGS. 2A-2L depict various replacement growth methods for forming replacement fins for a FinFET semiconductor device. In the attached drawings, the device 100 is depicted as being formed above a semiconductor substrate 10 comprised of a first semiconductor material, such as, for example, silicon, etc. The illustrative substrate 10 may be a bulk semiconductor substrate, or it may be the active layer of a so-called SOI (silicon-on-insulator) substrate or a so-called SGOI (silicon-germanium-on-insulator) substrate. Thus, the terms "substrate," "semiconductor substrate" or "semiconducting substrate" should be understood to cover all semiconductor materials and all forms of such semiconductor materials.

Figure 2A:
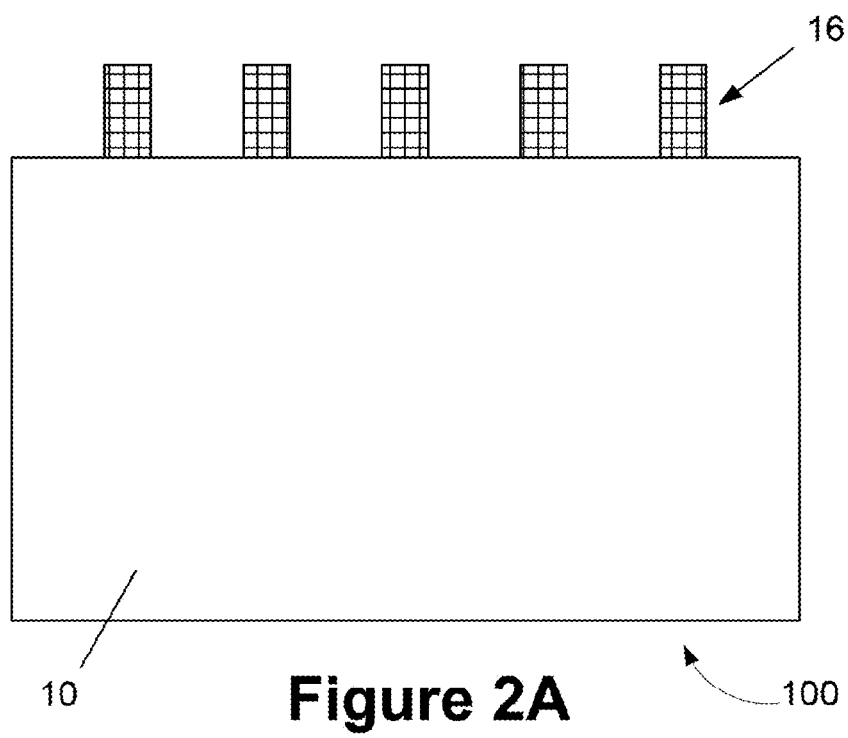

At the point of fabrication depicted in FIG. 2A, a patterned etch mask 16 has been formed above the substrate 10. In one illustrative embodiment, the patterned etch mask 16 may be patterned using known sidewall image transfer techniques and/or photolithographic techniques combined with performing known etching techniques. The patterned etch mask 16 may be comprised of a variety of different materials and take a variety of different forms. The patterned etch mask 16 is intended to be representative in nature as it could be comprised of a variety of materials, such as, for example, silicon nitride, silicon oxynitride, hafnium oxide, etc. Moreover, the patterned etch mask 16 could be comprised of multiple layers of material. For example, the patterned etch mask 16 may be comprised of a layer of silicon dioxide, e.g., a pad oxide layer, and a layer of silicon nitride, e.g., a pad nitride layer, that were formed above the substrate 10 by performing known deposition techniques, e.g., chemical vapor deposition (CVD) processes, atomic layer deposition (ALD) processes, etc. The patterned etch mask 16 may be patterned by forming a patterned photoresist etch mask (not shown) above the one or more deposited layers of material and thereafter performing one or more etching processes on the layer(s) through the patterned photoresist etch mask. Thus, the particular form and composition of the patterned etch mask 16, and the manner in which it is made, should not be considered a limitation of the present invention.

Figure 2B:
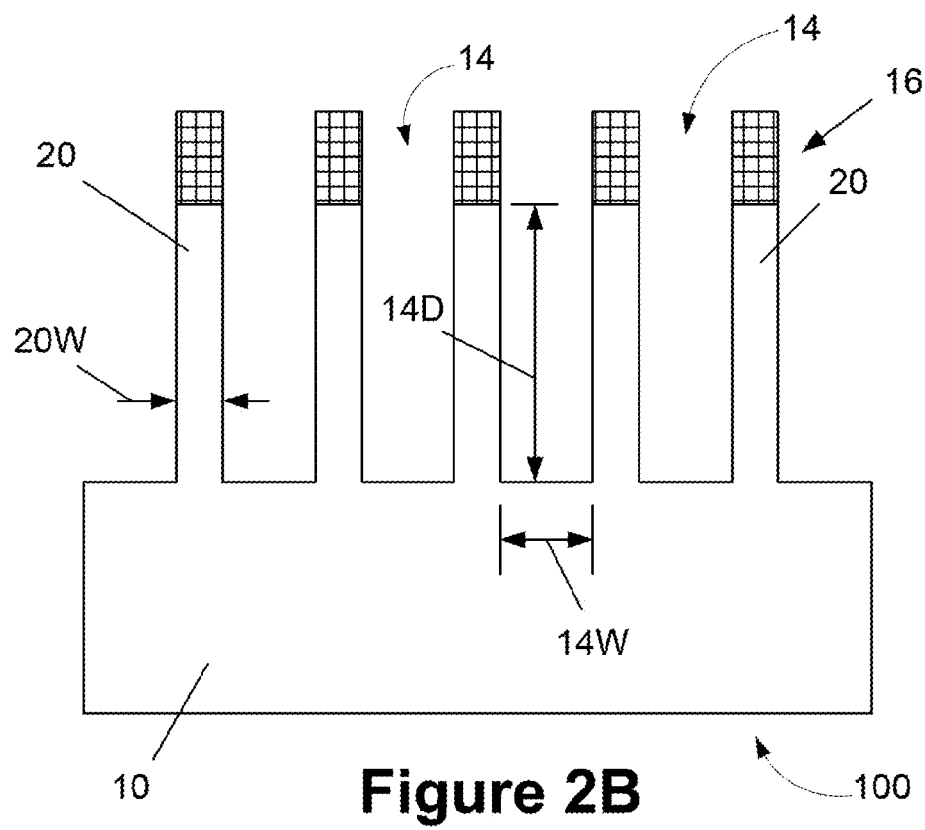

With reference to FIG. 2B, an etching process, such as a dry or wet etching process, is then performed on the substrate 10 through the patterned etch mask 16 to form a plurality of trenches 14. This etching process results in the definition of a plurality of substrate fins 20. In some applications, a further etching process may be performed to reduce the width or to "thin" the substrate fins 20, although such a thinning process is not depicted in the attached drawings. For purposes of this disclosure and the claims, the use of the terms "fin" or "fins" should be understood to refer to fins that have not been thinned as well as fins that have been subjected to such a thinning etch process.

With continuing reference to FIG. 2B, the overall size, shape and configuration of the trenches 14 and substrate fins 20 may vary depending on the particular application. The depth 14D and width 14W of the trenches 14 may vary depending upon the particular application. In one illustrative embodiment, based on current day technology, the depth 14D of the trenches 14 may range from approximately 30-150 nm and the width 14W of the trenches 14 may be about 20 nm or less. In some embodiments, the substrate fins 20 may have a final width 20W within the range of about 15-20 nm. In the illustrative examples depicted in the attached figures, the trenches 14 and substrate fins 20 are all of a uniform size and shape. However, such uniformity in the size and shape of the trenches 14 and the substrate fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14 and the substrate fins 20, and the manner in which they are made, should not be considered a limitation of the present invention. For ease of disclosure, only the substantially rectangular trenches 14 and substrate fins 20 will be depicted in subsequent drawings.

Figure 2C:
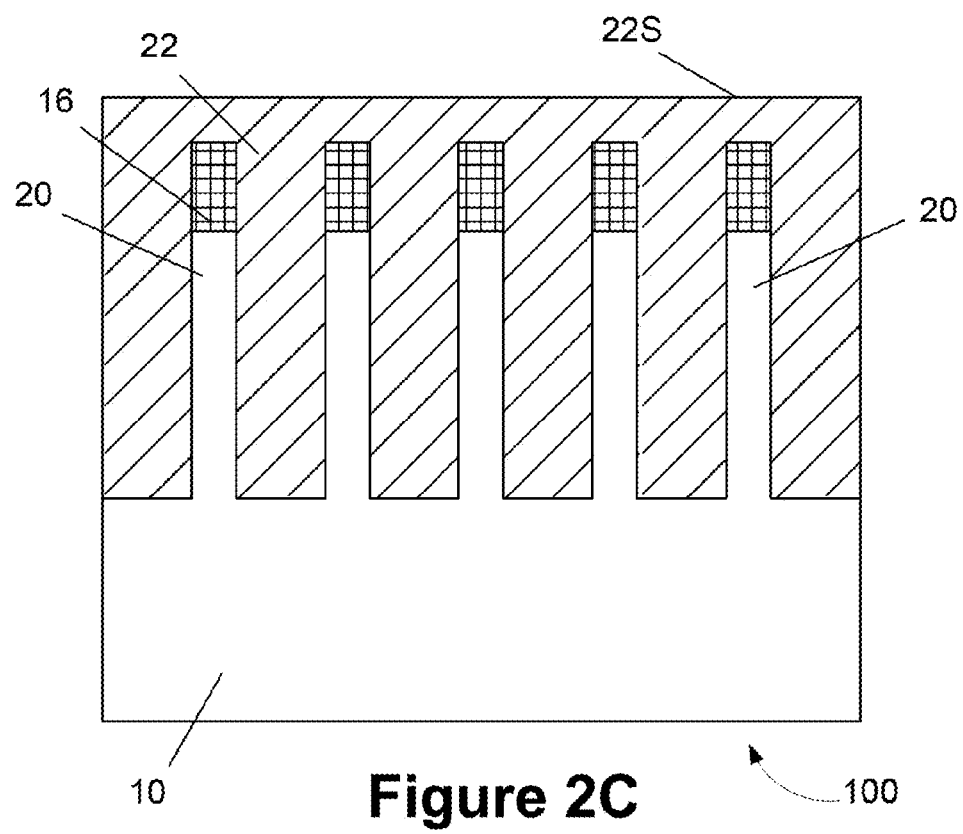

Then, as shown in FIG. 2C, a layer of insulating material 22 is formed in the trenches 14 of the device such that it overfills the trenches 14. The layer of insulating material 22 may be comprised of a variety of different materials, such as silicon dioxide, etc., and it may be formed by performing a variety of techniques, e.g., CVD, spin-coating, etc. In one illustrative embodiment, the layer of insulating material 22 may be a flowable oxide material that is formed by performing a CVD process. Such a flowable oxide material is adapted for use with substrate fins 20 of different configurations, even substrate fins 20 with a reentrant profile. In the example depicted in FIG. 2C, the surface 22S of the layer of insulating material 22 is the "as-deposited" surface of the layer of insulating 22. In this example, the surface 22S of the layer of insulating material 22 may be positioned slightly above the upper surface of the patterned etch mask 16.

Figure 2D:
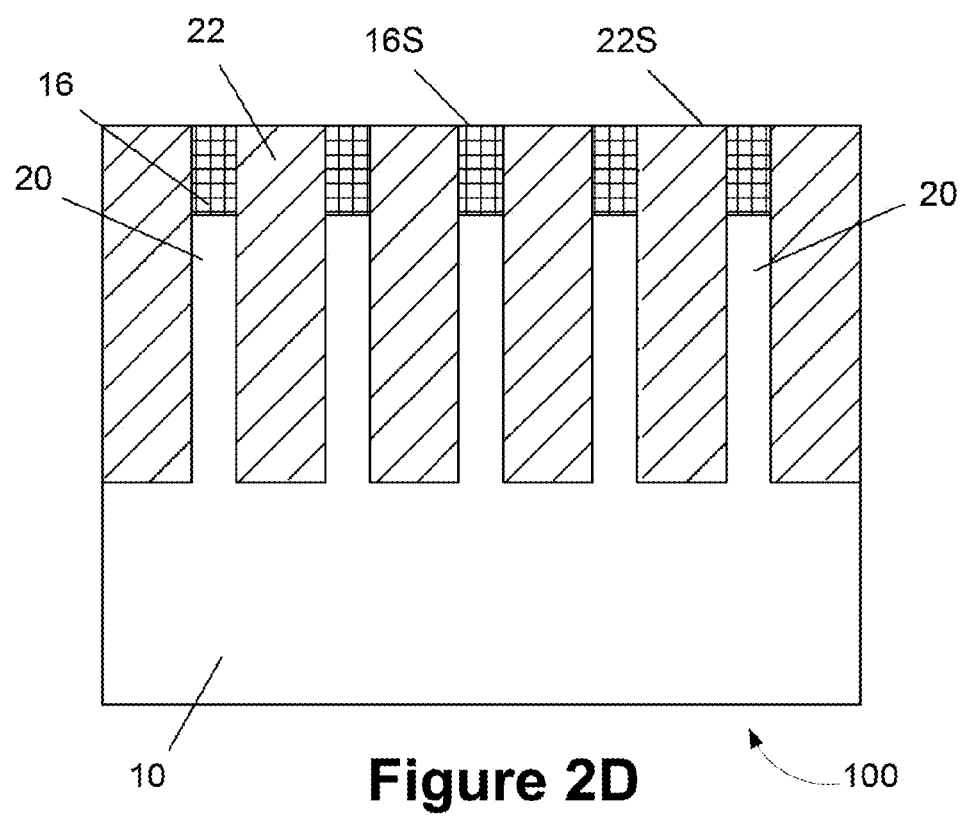

Next, as shown in FIG. 2D, one or more chemical mechanical polishing (CMP) processes may be performed to planarize the surface 22S using the patterned etch mask 16 to stop the CMP process. After such a CMP process, the surface 22S of the layer of insulating material 22 is substantially level with the surface 16S of the patterned etch mask 16.

Figure 2E:
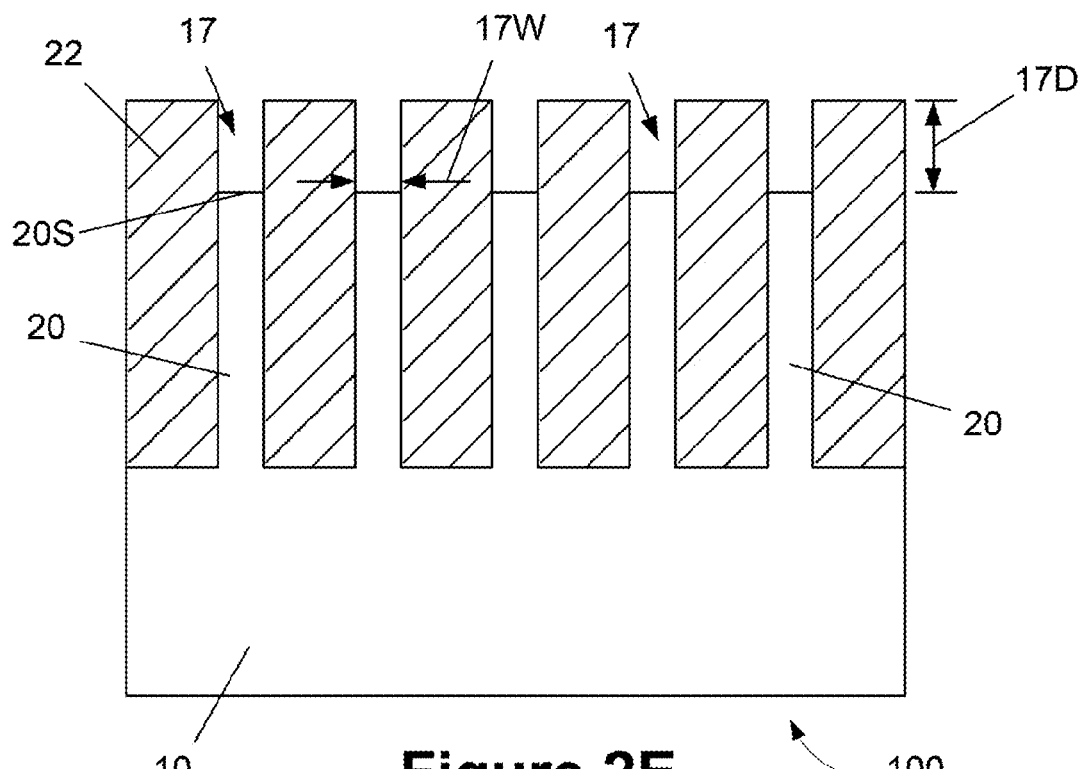

Next, as shown in FIG. 2E, one or more etching processes, wet or dry, are performed to remove the patterned etch mask 16 from above the substrate fins 20 and thereby define a plurality of substrate fin cavities 17 that expose the upper surface 20S of the substrate fins 20 for further processing. In one illustrative embodiment, using current-day technologies, the substrate fin cavities 17 may have a bottom width 17W of about 15-20 nm and a height or depth 17D of about 30-60 nm. In general, the substrate fin cavities 17 will have an aspect ratio (L/D) of less than about 3-3.5. In general, the depth 17D of the substrate fin cavities 17 will be approximately equal to or slightly greater than the overall height of the alternative fin material that is to be formed in the cavities 17. Importantly, using the confined replacement growth methods disclosed herein, the depth 17D of the substrate fin cavities 17 is greater than the unconfined stable critical thickness of an alternative semiconductor material to be formed in the cavities 17. As used herein and in the attached claims, the phrase "unconfined stable critical thickness" for a particular material refers to the thickness to which a substantially defect-free, fully-strained, stable layer of that particular material may be blanket-deposited (by performing an epitaxial deposition process) on a silicon substrate or in a trench having a relatively wide width, e.g., 800 nm or greater. Additionally, as used herein and in the attached claims, the phrase "unconfined metastable critical thickness" for a particular material refers to the thickness to which a partially-strained, metastable layer of that particular material may be blanket-deposited (by performing an epitaxial deposition process) on a silicon substrate or in a trench having a relatively wide width, e.g., 800 nm or greater. Although not depicted in the drawings, after the patterned etch mask 16 has been removed, if desired, another etching process, such as a dry, wet or vapor phase etching process, may be performed to reduce the height of the substrate fins 20, i.e., increase the depth 17D of the substrate fin cavities 17.

Figure 2F:
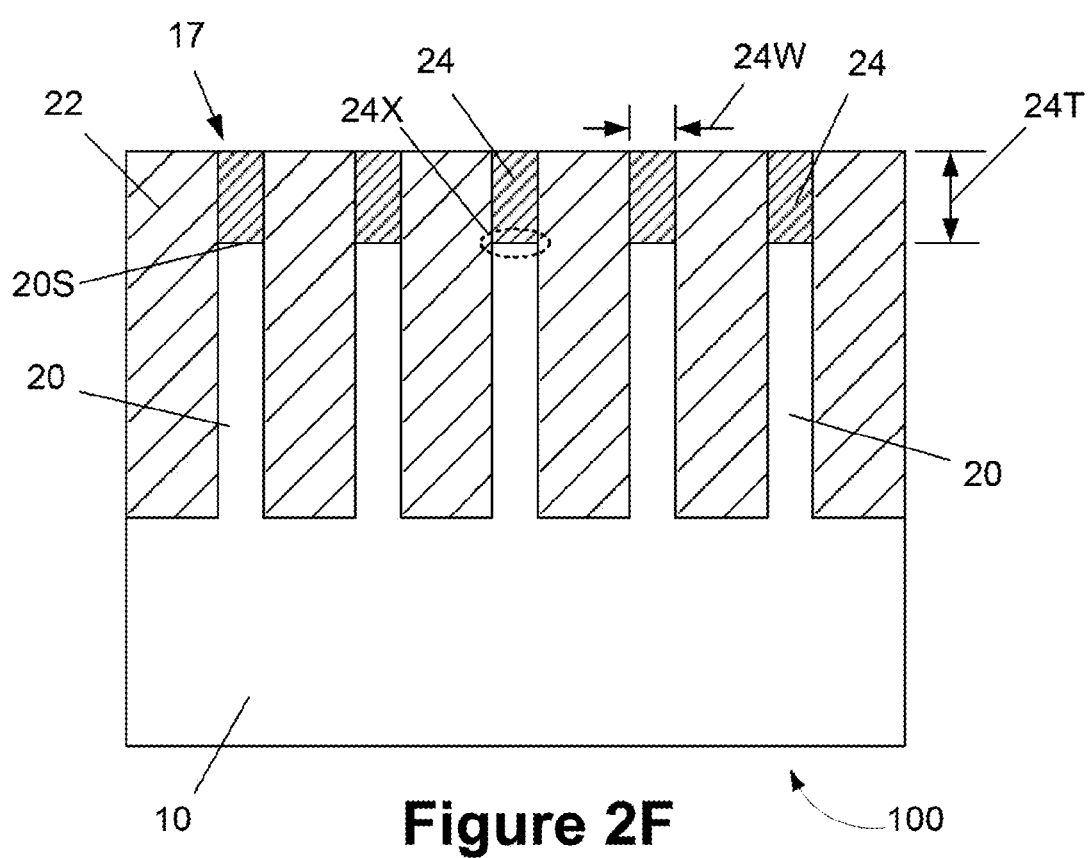

Next, as shown in FIG. 2F, an epitaxial deposition process is performed to form a plurality of replacement fins 24 having a thickness 24T in the substrate fin cavities 17 on the upper surfaces 20S of the substrate fins 20. The replacement fins 24 formed herein may be in either a stable or metastable condition. Importantly, in one illustrative embodiment, the replacement fins 24 disclosed herein are formed such that they are in a stable, fully-strained condition wherein they are fully-strained (100%) along the axial length direction of the replacement fin 24—i.e., a uni-axial, fully-strained material. In such a uni-axial, fully-strained condition, the replacement fins 24 are substantially defect-free throughout their entire thickness 24T, i.e., the replacement fins 24 are substantially defect-free from the interface 20S with the substrate fins 20 though the entire thickness 24T (or height) of the replacement fins 24. That is, using the methods disclosed herein, stable replacement fins 24 may be formed to a thickness 24T (or height) that is greater than the unconfined stable critical thickness for the material of the replacement fin 24, i.e., the depth 17D of the substrate fin cavities 17 is greater than the unconfined stable critical thickness for the material of the stable replacement fin 24. As used herein and in the attached claims, the reference to a fin material being a "stable material" or in a "stable condition" means that the material is in a fully-strained (100%) condition along the crystalline plane that corresponds to the axial length of the replacement fin 24 and that the material has a defect density of less than $10^4$ defects/$cm^2$.

In another illustrative embodiment, the replacement fins 24 may be formed in a metastable condition, wherein they are partially-strained (strained between 1-99%) along the crystalline plane that corresponds to the axial length direction (perpendicular to the drawing plane in FIG. 2F) of the fin 24—i.e., a uni-axial, partially-strained material. As used herein and in the attached claims, the reference to a fin material being a "metastable material" or in a "metastable condition" means that the material is in a partially-strained (1-99%) condition in the crystalline plane that corresponds to the axial length direction of the replacement fin 24 and that the material has a defect density of less than $10^5$ defects/$cm^2$. In the case where the replacement fins 24 are in a metastable condition, there may be a portion or region 24X of the replacement fin 24 near the interface with the substrate fin 20, e.g., a region 24X having a thickness of about 2-5 nm, where a relatively larger number of defects may be present than are otherwise present in the metastable material, e.g., more than $10^5$ defects/$cm^2$, but otherwise the replacement fin 24 may still have a defect density of less than $10^5$ defects/$cm^2$ above that defect-containing interface region 24X, i.e., the metastable replacement fin 24 may have a defect density of $10^5$ defects/$cm^2$ or less throughout at least 90% of its entire height 24T. That is, using the methods disclosed herein, metastable replacement fins 24 may be formed to a thickness 24T (or height) that is greater than the unconfined metastable critical thickness for the material of the metastable replacement fin 24, i.e., the depth 17D of the substrate fin cavities 17 is greater than the unconfined metastable critical thickness for the material of the replacement fin 24.

The defect density of the various materials described herein may be determined by well-known x-ray diffraction techniques. In general, such x-ray diffraction techniques involve defect density elucidation from rocking curves or through symmetric and asymmetric reciprocal space mapping ($\Theta$-$2\Theta$ mapping).

The replacement fins 24 are comprised of a semiconductor material that is different than the semiconductor material of the substrate fins 20. The replacement fins 24 may be comprised of a variety of different semiconductor materials, e.g., silicon germanium, silicon carbon, one or more III-V materials, one or more II-VI materials, InP, InAs, GaAs, InGaAs, InSb, InGaSb, etc., or combinations thereof, and it may be either doped (in situ) or undoped. In one illustrative embodiment, the replacement fins 24 may be silicon germanium or germanium-containing material in a stable condition, and the thickness 24T (or height) of the stable or metastable replacement fins 24 may be about 65 nm, a height sufficient to allow for the formation of a channel region on a FinFET device. In the depicted example, the epitaxial deposition process was performed until such time as the upper surfaces of the replacement fins 24 were substantially flush with the upper surface of the layer of insulating material 22. As will be understood by those skilled in the art after a complete reading of the present application, all such epitaxially grown hetero-structures will exhibit at least some level of defects due to the nature of the process and the difference in lattice constants between the different materials. For example, even a fully-strained, stable alternative fin material will exhibit some degree of defects. Metastable materials (partially-strained materials that are relaxed to some degree) will also exhibit defects, perhaps to a greater degree than that of stable materials grown in a similar fashion.

Figure 2G:
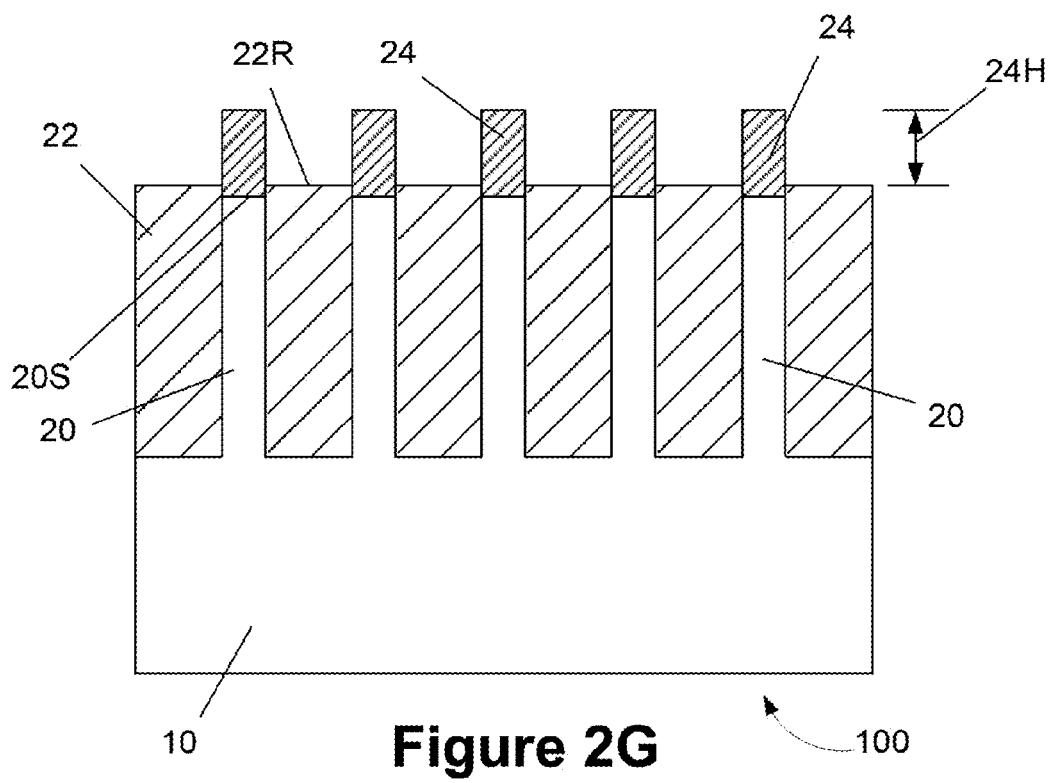

FIG. 2G depicts the device 100 after an etching process has been performed on the layer of insulating material 22 to reduce its thickness and thereby result in the layer of insulating material having a recessed surface 22R. The recessed surface 22R of the layer of insulating material 22 essentially defines the final active fin height 24H of the replacement fins 24. The final active fin height 24H may vary depending upon the particular application and, in one illustrative embodiment, may range from about 30-60 nm.

Figure 2H:
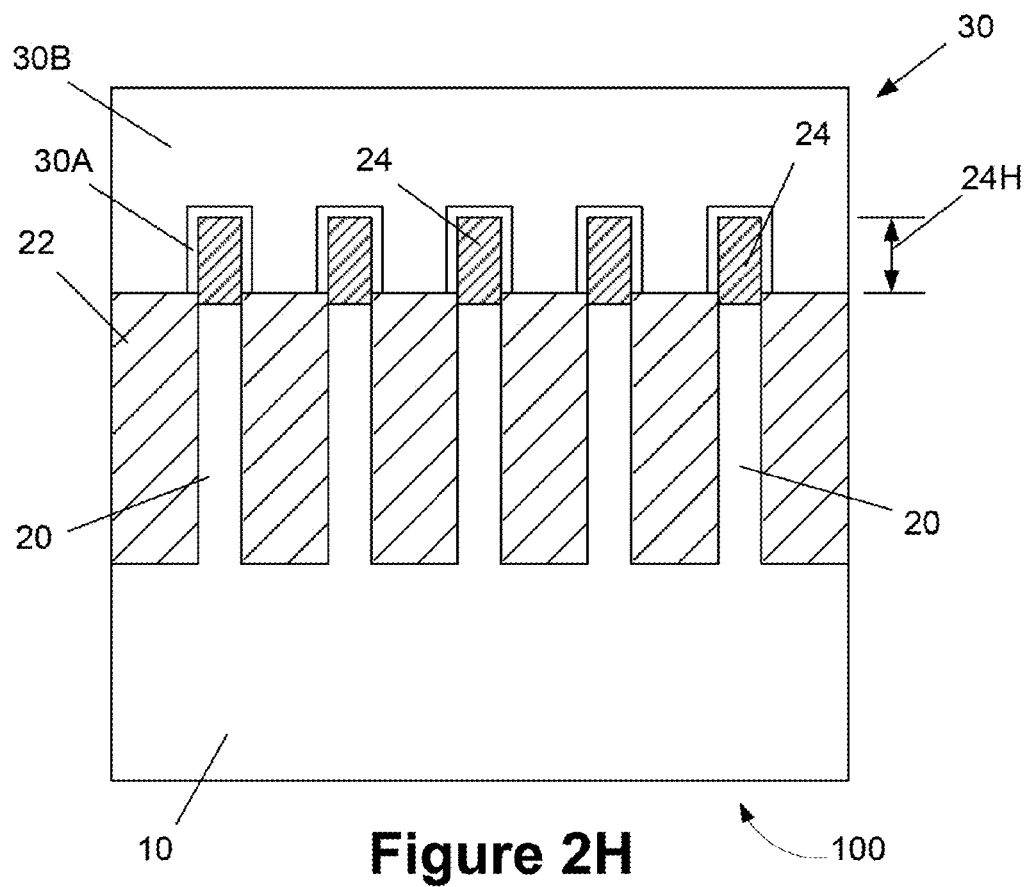

At the point of processing depicted in FIG. 2H, the illustrative FinFET device 100 may be completed using traditional fabrication techniques. For example, FIG. 2H depicts the device 100 after an illustrative gate structure 30 has been formed for the device 100. In one illustrative embodiment, the schematically depicted gate structure 30 includes an illustrative gate insulation layer 30A and an illustrative gate electrode 30B. The gate insulation layer 30A may be comprised of a variety of different materials, such as, for example, silicon dioxide, a so-called high-k (k greater than 10) insulation material (where k is the relative dielectric constant), etc. Similarly, the gate electrode 30B may also be of a material such as polysilicon or amorphous silicon, or it may be comprised of one or more metal layers that act as the gate electrode 30B. As will be recognized by those skilled in the art after a complete reading of the present application, the gate structure 30 of the device 100 depicted in the drawings, i.e., the gate insulation layer 30A and the gate electrode 30B, is intended to be representative in nature. That is, the gate structure 30 may be comprised of a variety of different materials and it may have a variety of configurations, and the gate structure 30 may be made using either the so-called "gate-first" or "replacement gate" techniques. In one illustrative embodiment, an oxidation process or a conformal deposition process may be performed to form a gate insulation layer 30A comprised of a material such as, for example, silicon dioxide, silicon nitride, hafnium oxide, a high-k (k value greater than 10) insulating material, etc., on the replacement fins 24. Thereafter, the gate electrode material 30B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure 30 by blanket-depositing a layer of spacer material and thereafter performing an anisotropic etching process to define the spacers.

Further techniques that may also be employed in forming replacement fins 24 described herein are set forth in the inventors' co-pending U.S. patent application Ser. No. 13/839,998 (filed on Mar. 15, 2013) entitled "Methods of Forming Low Defect Replacement Fins for a FinFET Semiconductor Device and the Resulting Devices," which is hereby incorporated by reference in its entirety. In general, that co-pending patent application describes a process whereby at least the sidewalls of the substrate fins 20 are substantially oriented in the <100> crystallographic direction of the substrate 10. In some embodiments, the long axis of the fins may also be oriented in the <100> direction of the substrate 10 (for a (100) substrate) or the long axis may be oriented in the <110> direction of the substrate 10 (for a (110) substrate). That is, in the cross-sectional views shown herein, the sidewalls of the substrate fins 20 are substantially positioned in the <100> crystallographic direction of the substrate 10. The degree to which the sidewalls of the substrate fins 20 are positioned in exactly the <100> crystalline orientation depends upon the cross-sectional shape of the substrate fins 20. In the case of the tapered substrate fins 20, the sidewalls of such tapered fins may be positioned slightly out of the <100> direction due to the tapered shape of the substrate fins 20. Of course, if desired, the substrate fins 20 may be manufactured to have more vertically oriented sidewalls or even substantially vertical sidewalls. The more vertical the sidewalls of the substrate fins 20, the more closely they will be positioned in the <100> direction of the substrate 10. Thus, in stating that the long-axis or centerline of the substrate fins 20 disclosed herein are positioned in the <100> direction of the substrate 10, it is intended to cover substrate fins 20 so oriented irrespective of their cross-sectional configuration, i.e., irrespective of whether the substrate fins 20 are tapered or rectangular or any other shape when viewed in cross-section.

Figure 2I:
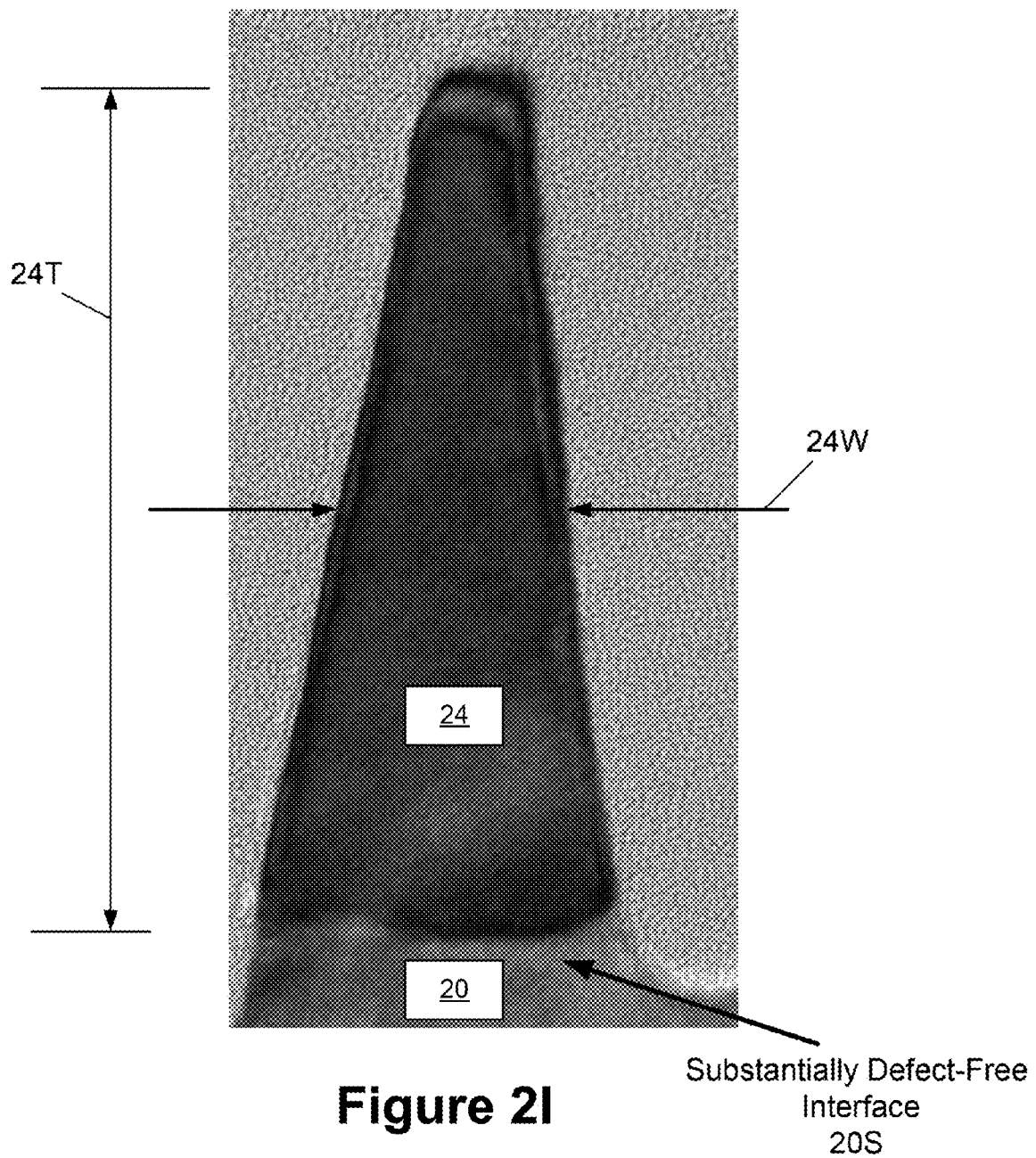

FIGS. 2I-2J are enlarged portions of TEM photographs of a device wherein the methods disclosed herein were employed to form a metastable replacement fin 24 on a substrate fin 20. FIG. 2I is a cross-sectional view of the replacement fin 24/substrate fin 20 wherein the long axis (axial length) of the substrate fins 24/20 (the axis that runs into and out of the drawing page) was positioned in the <100> direction of a (100) silicon substrate 10. In the case of the tapered substrate fin 20 shown in FIG. 2I, the sidewalls of such tapered fins may be positioned slightly out of the <100> direction due to the tapered shape of the depicted fin 24. FIG. 2J is a cross-sectional view of the replacement fin 24/substrate fin 20 taken through the long axis (axial length) of the replacement fin 24/substrate fin 20.

Figure 1C:
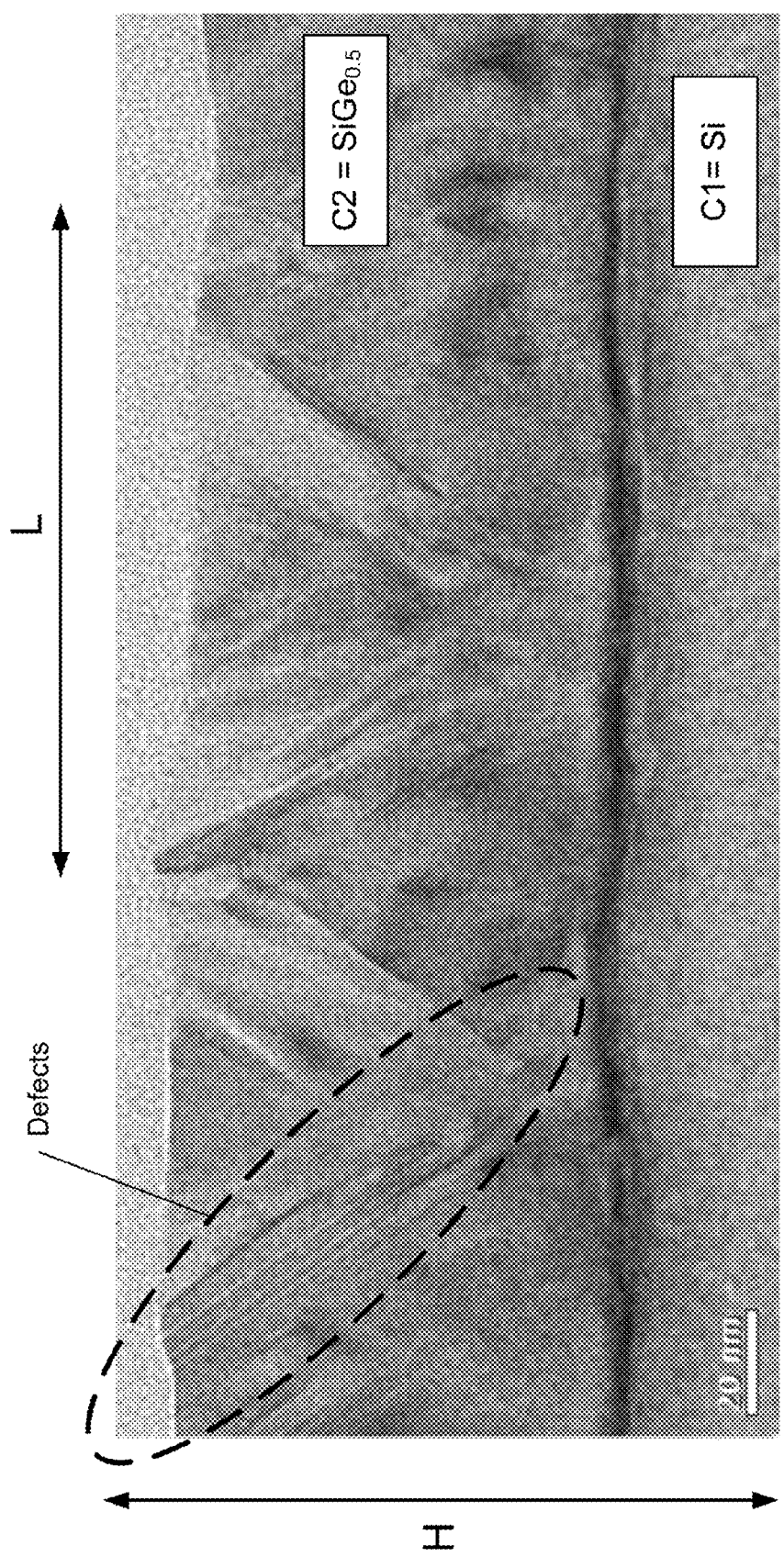

In the depicted example, the metastable replacement fins 24 were made of germanium and they were formed by performing an epitaxial deposition process. The conditions of the epitaxial deposition process were as follows: a temperature of 450° C.; a pressure of 10 Torr; and a duration of about 10 minutes, using germane as the precursor gas. In this example, the pure germanium, metastable replacement fins 24 have a thickness 24T of about 60 nm and a mid-height width or thickness 24W of about 10 nm. Importantly, although defects 37 are clearly present at the interface 20S between the substrate fin 20 and the replacement fin 24, there are few if any defects throughout the remaining thickness 24T (or height) of the metastable replacement fins 24, when viewed in cross-section. In this example, the metastable replacement fin 24 is fully relaxed in the thickness 24T (height) direction and the width 24W direction, but it is partially-strained in the axial length direction. FIG. 2J shows that the interface 20S between the replacement fin 24 and the substrate fin 20 is also substantially free of defects along the axial length of the replacement fin 24/substrate fin 20. Typically, the germanium material used to form the metastable replacement fins 24 shown in FIGS. 2I-2J has an unconfined maximum stable critical thickness (as defined above) of about 1-2 nm and an unconfined maximum metastable critical thickness of about 4 nm. At thicknesses above that unconfined maximum metastable critical thickness, it would normally be expected that the germanium material used for the replacement fins 24 would begin to exhibit defects indicative of degree of stress relaxation that it is not consistent with a material being in a metastable condition, i.e., exhibit a defect level consistent with the germanium material being at a point of relaxation beyond that of a metastable material. Stated another way, a prior art alternative fin material, e.g., SiGe that was formed by growing a layer of the alternative fin material (with a thickness greater than its maximum metastable critical thickness) on a substrate, thereafter etching the layer of the alternative material to define the fins and then forming an oxide material between the etched fins grown, would be fully relaxed along all three axes of the material, i.e., the width of the fin, the vertical height of the fin and the axial length of the fin. Such a fin structure would exhibit a substantial number of defects, such as those depicted in the fin portion C2 shown in FIG. 1C. In contrast, using the methods disclosed herein, the metastable replacement fin 24 shown in FIGS. 2I-2J is grown to a thickness greater than its maximum metastable critical thickness but it is not fully relaxed in all three planes, i.e., it is partially-strained in the axial length directions. That is, while the metastable replacement fin 24 shown in FIGS. 2I-2J is fully relaxed in both the fin thickness 24T (height) and fin width directions 24W, the metastable replacement fin 24 is not fully relaxed along the axial length (see FIG. 2J) of the metastable replacement fin 24. Rather, the metastable replacement fin 24 is partially-strained, e.g., approximately 50% strained at its mid-height level along the axial length of the metastable replacement fin 24, even though it was grown to a thickness greater than the maximum metastable critical thickness of the alternative fin 24 material. That is, using the novel methods disclosed herein, the metastable replacement fins 24 were formed to a thickness 24T that is greater than the unconfined maximum metastable critical thickness of the germanium material used to form the metastable replacement fins 24.

Figure 2K:
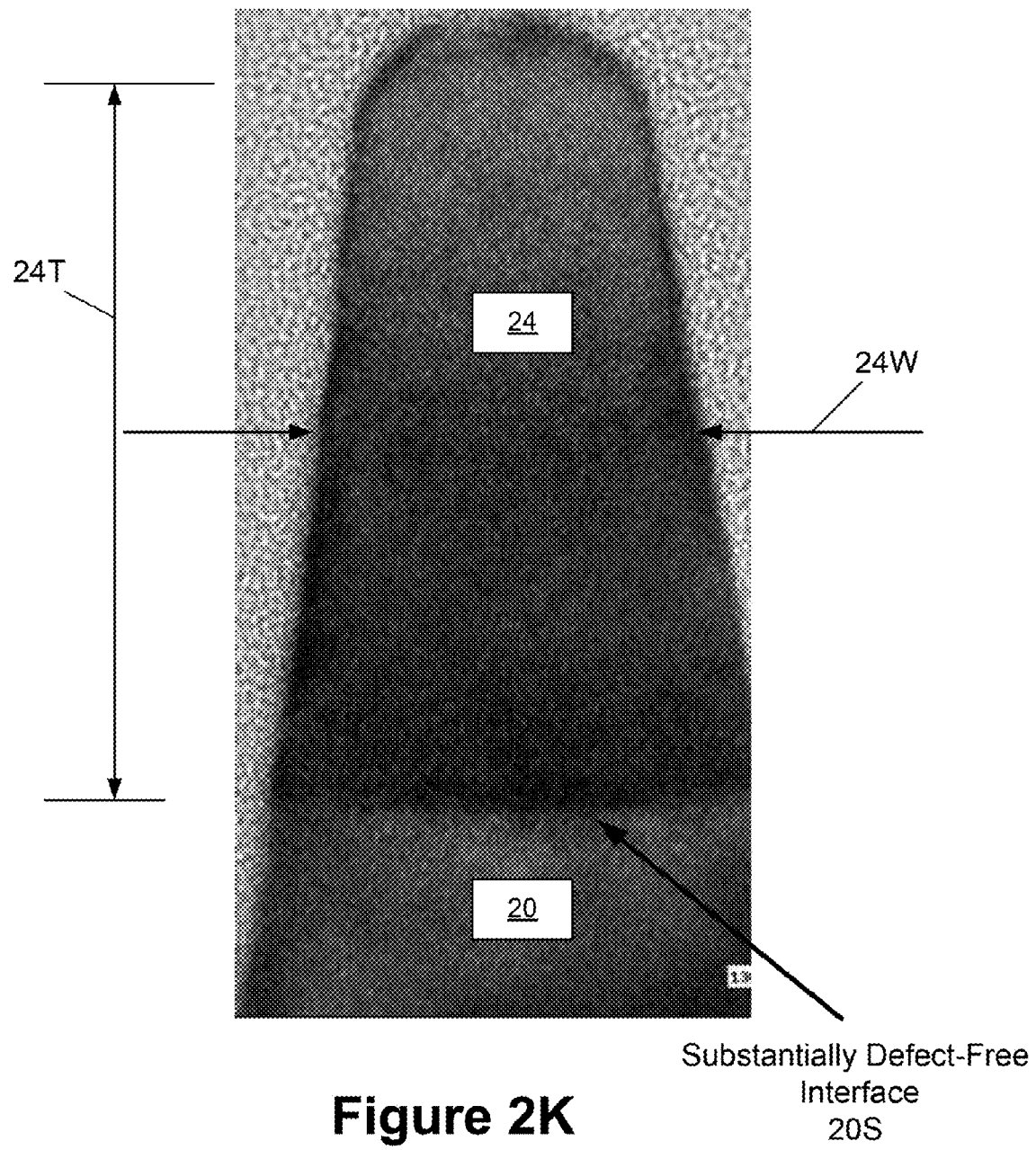
Figure 2L:
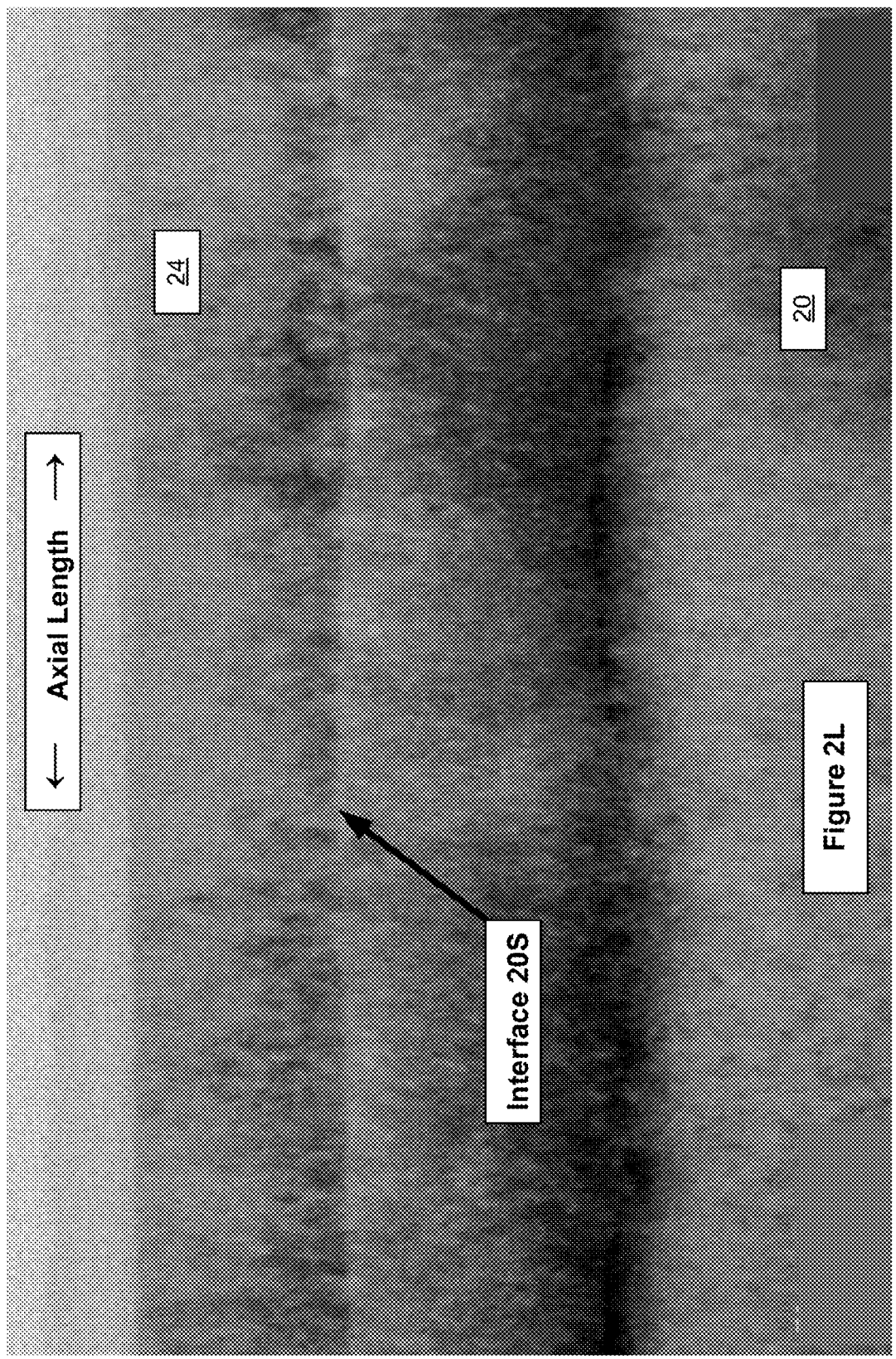

FIGS. 2K-2L are enlarged portions of TEM photographs of a device wherein the methods disclosed herein were employed to form a stable replacement fin 24 on a substrate fin 20. FIG. 2K is a cross-sectional view of the replacement fin 24/substrate fin 20 wherein the long axis (axial length) of the substrate fins 24/20 (the axis that runs into and out of the drawing page) was positioned in the <100> direction of a (100) silicon substrate 10. In the case of the tapered substrate fins 20 shown in FIG. 2K, the sidewalls of such tapered fins may be positioned slightly out of the <100> direction due to the tapered shape of the depicted fin 24. FIG. 2L is a cross-sectional view of the replacement fin 24/substrate fin 20 taken through the long axis (axial length) of the replacement fin 24/substrate fin 20.

In the depicted example, the stable replacement fins 24 were made of silicon germanium ($SiGe_{0.75}$) and they were formed by performing an epitaxial deposition process. The conditions of the epitaxial deposition process were as follows: a temperature of 450° C.; a pressure of 10 Torr; and a duration of about 10 minutes, using germane as the precursor gas. In this example, the silicon germanium, stable replacement fins 24 have a thickness 24T of about 60 nm and a mid-height width or thickness 24W of about 10 nm. Importantly, the replacement fin 24 is substantially free of defects throughout it thickness 24T (or height) as well as at the interface 20S. In this example, the stable replacement fin 24 is fully relaxed in the thickness 24T (height) direction and the width 24W direction, but it is fully-strained in the axial length direction. Typically, the silicon germanium ($SiGe_{0.75}$) material used to form the stable replacement fins 24 shown in FIGS. 2K-2L has an unconfined maximum stable critical thickness (as defined above) of about 3 nm. At thicknesses above that unconfined maximum stable critical thickness, it would normally be expected that the silicon germanium ($SiGe_{0.75}$) material used for the replacement fins 24 would begin to exhibit defects indicative of degree of stress relaxation that it is not consistent with a material being in a stable condition, i.e., exhibit a defect level consistent with the silicon germanium ($SiGe_{0.75}$) material being at a point of relaxation beyond that of a stable material. However, using the methods disclosed herein, the stable replacement fin 24 shown in FIGS. 2K-2L was formed to a thickness 24T that is greater than the unconfined maximum stable critical thickness of the silicon germanium ($SiGe_{0.75}$) material used to form the stable replacement fins 24.

As will be appreciated by those skilled in the art after a complete reading of the present application, the methods disclosed herein are broadly directed to various methods of forming stable and metastable replacement fins for a FinFET device. The formation of such stable and metastable replacement fin structures enables the formation of devices and circuits that may operate at higher efficiencies as compared to prior art devices. The replacement fin process disclosed herein is different from the ART process discussed in the background section of this application. In the typical prior art ART process, the alternative fin materials were grown in trenches having relatively very large aspect ratios, e.g., 25-30. As a result, the alternative fin material was grown to a thickness (or fin height) of between 200-300 nm or greater. In the ART process, there was typically a region adjacent the interface between the substrate fin and the alternative fin material where a substantial number of defects were intentionally created and trapped against the sidewalls of the trench. Typically, this region extended for a distance of about 50 nm in thickness (or height) above the interface between the two materials. Thereafter, the defect density in the alternative material gradually decreased as the growth of the alternative fin material continued. The additional thickness (or height) of the alternative material was believed to be required to allow the alternative material to totally relax (in all three directions) at a location that started a significant distance above the interface between the substrate fin and the alternative fin material. That is, the alternative fin material was grown to such a large thickness (fin height) in order to "get away from" or limit the impact of the crystalline structure of the substrate fin on the growth of the alternative fin material. In the ART process, at some location above the interface between the substrate fin and the alternative fin material, the relatively smaller lattice structure of the silicon substrate fin had little to no effect on the relatively larger lattice structure of the germanium material. Thus, at that height level, relatively defect-free germanium material begins to grow (and continued to grow) on substantially crystalline germanium material, albeit in totally relaxed condition. Accordingly, in the prior art ART process, device designers were motivated to grow very thick (or tall) fins of such alternative material so as to achieve a relatively defect-free, completely relaxed alternative fin material near the upper portion of the alternative fin material.

In contrast, in the replacement fin process disclosed herein, the inventors have discovered, contrary to the drive to grow very thick layers of alternative fin material using the ART process, stable or metastable replacement fin material may be formed in relatively thin layers (as compared to the traditional ART process), wherein the quality and total thickness (or height) of the alternative fin material is sufficient for fin channel formation for a FinFET device. Moreover, unlike the ART process, in the methods disclosed herein, the replacement fins are grown in trenches having a relatively small aspect ratio, and the replacement fin material is grown to relatively thinner thicknesses (or heights), e.g., 30-60 nm as compared to 200-300 nm thick alternative fin materials formed using traditional ART processing techniques. This critical and surprising discovery enables the formation of stable and metastable fin materials that may be used to form fins for FinFET devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a trench in a layer of insulating material that is positioned above a substrate comprised of a first semiconductor material, said trench exposing a surface of said substrate, said trench having a width at a bottom of said trench that is less than or equal to 20 nm and a depth that is 60 nm or less; and performing an epitaxial deposition process to form a stable replacement fin material above said exposed surface of said substrate, wherein said replacement fin has a height that is 60 nm or less and it is fully strained in a direction that corresponds to an axial length direction of said replacement fin, wherein said replacement fin is comprised of a second semiconductor material that is different than said first semiconductor material and wherein said replacement fin material has a defect density of $10^4$ defects/cm$^2$ or less throughout an entire height of the replacement fin material.

2. The method of claim 1, wherein said height of said replacement fin is greater than an unconfined stable critical thickness of said second semiconductor material.

3. The method of claim 1, wherein said replacement fin has tapered sidewalls.

4. The method of claim 1, wherein said replacement fin is substantially strain-free in directions that correspond to a height direction and a lateral width direction of said replacement fin.

5. The method of claim 1, wherein said first semiconducting material is comprised of silicon, said second semiconductor material is comprised of one of silicon germanium, germanium, a III-V material, a II-VI material, or a combination thereof.

6. The method of claim 1, wherein, at an interface between said replacement fin material and said substrate, the replacement fin material is free of a misfit dislocation in a crystalline structure of the replacement fin material.

7. A method, comprising:

forming a trench in a layer of insulating material that is positioned above a substrate comprised of a first semiconductor material, said trench exposing a surface of said substrate, said trench having a width at a bottom of said trench that is less than or equal to 20 nm and a depth that is 60 nm or less; and performing an epitaxial deposition process to form a stable replacement fin material above said exposed surface of said substrate, wherein said replacement fin:
   a) has a height that is 60 nm or less and it is fully strained in a direction that corresponds to an axial length direction of said replacement fin;
   b) is comprised of a second semiconductor material that is different than said first semiconductor material;
   c) has a defect density of $10^4$ defects/cm$^2$ or less throughout an entire height of the replacement fin material, wherein said entire height of said replacement fin is greater than an unconfined stable critical thickness of said second semiconductor material; and
   d) is substantially strain-free in directions that correspond to a height direction and a lateral width direction of said replacement fin.

8. The method of claim 7, wherein, at an interface between said replacement fin material and said substrate, said replacement fin material is free of a misfit dislocation in a crystalline structure of said replacement fin material.

9. A method, comprising:

forming a trench in a layer of insulating material that is positioned above a substrate comprised of a first semiconductor material, said trench exposing a surface of said substrate, said trench having a width at a bottom of said trench that is less than or equal to 20 nm; and performing an epitaxial deposition process to form a stable replacement fin material above said exposed surface of said substrate, wherein said replacement fin:
   a) has a height that is 60 nm or less and it is fully strained in a direction that corresponds to an axial length direction of said replacement fin;
   b) is comprised of a second semiconductor material that is different than said first semiconductor material; and
   c) has a defect density of $10^4$ defects/cm$^2$ or less throughout an entire height of said replacement fin material, wherein said entire height of said replacement fin is greater than an unconfined stable critical thickness of said second semiconductor material.

10. The method of claim 9, wherein, at an interface between said replacement fin material and said substrate, said replacement fin material is free of a misfit dislocation in a crystalline structure of said replacement fin material.

11. The method of claim 9, wherein said replacement fin is substantially strain-free in directions that correspond to a height direction and a lateral width direction of said replacement fin.

12. The method of claim 9, wherein said first semiconductor material is silicon and said second semiconductor material is silicon-germanium.

* * * * *